United States Patent
Sato et al.

(10) Patent No.: US 9,054,006 B2
(45) Date of Patent: Jun. 9, 2015

(54) RADIATION DETECTOR WITH DEFECTIVE PIXELS PREVENTION STRUCTURE

(75) Inventors: Kenji Sato, Kyoto (JP); Hisao Tsuji, Kyoto (JP)

(73) Assignee: SHIMADZU CORPORATION, Kyoto (JP)

( * ) Notice: Subject to any disclaimer, the term of this patent is extended or adjusted under 35 U.S.C. 154(b) by 0 days.

(21) Appl. No.: 14/119,404

(22) PCT Filed: May 30, 2011

(86) PCT No.: PCT/JP2011/003001
§ 371 (c)(1),
(2), (4) Date: Nov. 21, 2013

(87) PCT Pub. No.: WO2012/164605
PCT Pub. Date: Dec. 6, 2012

(65) Prior Publication Data
US 2014/0167194 A1   Jun. 19, 2014

(51) Int. Cl.
*H01L 31/115*   (2006.01)
*H01L 27/146*   (2006.01)

(52) U.S. Cl.
CPC .... *H01L 27/14636* (2013.01); *H01L 27/14603* (2013.01); *H01L 27/14618* (2013.01); *H01L 27/14676* (2013.01); *H01L 31/115* (2013.01)

(58) Field of Classification Search
CPC .................................................. H01L 31/115
See application file for complete search history.

(56) References Cited

U.S. PATENT DOCUMENTS

| 2004/0164230 A1 | 8/2004 | Izumi et al. |
| 2008/0224055 A1 | 9/2008 | Nariyuki |
| 2009/0004768 A1 * | 1/2009 | Watanabe et al. ................ 438/64 |
| 2009/0040310 A1 * | 2/2009 | Nomura et al. ............... 348/162 |

FOREIGN PATENT DOCUMENTS

| JP | 2004-228448 A | 8/2004 |
| JP | 2008-227347 A | 9/2008 |
| JP | 2009-088183 A | 4/2009 |
| JP | 2009-092645 A | 4/2009 |
| JP | 2009-099941 A | 5/2009 |

OTHER PUBLICATIONS

International Search Report, w/ English translation thereof, issued in International Patent Application No. PCT/JP2011/003001 dated Jul. 12, 2011.

* cited by examiner

*Primary Examiner* — Evan Pert
(74) *Attorney, Agent, or Firm* — McDermott Will & Emery LLP (57) ABSTRACT

Provision is a radiation detector that allows eliminating short between electric wires crossing over each other via an interlayer insulating layer and thus suppression of defective detecting elements. A construction of this embodiment has a design idea that eliminates short between electric wires of an amorphous selenium layer and an active matrix substrate. Specifically, the electric wires are in a position covered with a thick center portion of the amorphous selenium layer. This ensures to separate the electric wires away from an electrode layer, achieving provision of a radiation detector capable of being used for a long period of time.

5 Claims, 8 Drawing Sheets

Prior art

Fig.18

Prior art

RADIATION DETECTOR WITH DEFECTIVE PIXELS PREVENTION STRUCTURE

RELATED APPLICATIONS

This application is a U.S. National Stage application under 35 U.S.C. §371, of International Application PCT/JP2011/003001 filed on May 30, 2011, which was published as WO 2012/164605 on Dec. 6, 2012. The application is incorporated herein by reference.

TECHNICAL FIELD

The present invention relates to a radiation detector configured to image radiation. More particularly, the present invention is directed to a radiation detector with enhanced durability due to suppression in increase of defective pixels.

BACKGROUND ART

Figure 15:
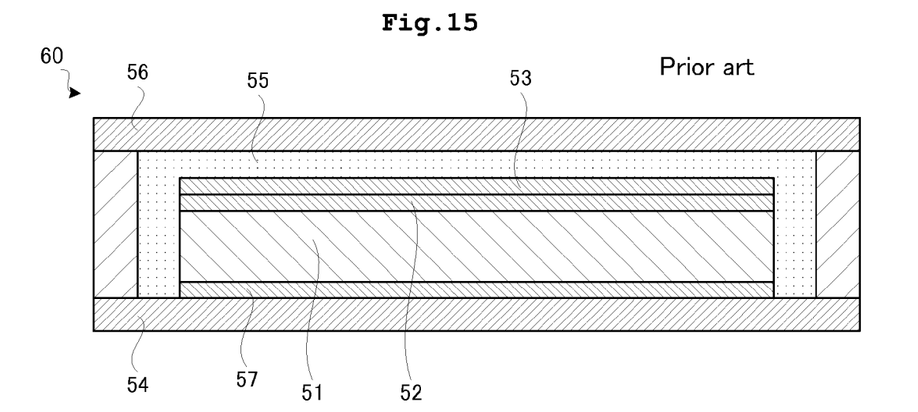
FIGS. 15 to 17 are sectional views each illustrating a conventional X-ray detector.

A radiation detector configured to image radiation is used in the medical field and other various fields. Description will be given of a concrete construction of such the radiation detector. A conventional radiation detector 60 includes, as illustrated in FIG. 15, an amorphous selenium layer 51 configured to convert radiation into a pair of carriers of electron and positive hole; high resistance films 52, 57 laminated so as to cover both faces of the amorphous selenium layer 51; an active matrix substrate 54 configured to contact the high resistance film 57 and having a thin-film transistor, an electric wire, and an interlayer insulating layer formed on a glass substrate; an electrode layer 53 laminated on the high resistance film 52; an insulating resin layer 55 configured to cover the amorphous selenium layer 51, the high resistance film 52, and the electrode layer 53; and a glass plate 56 configured to cover the insulating resin layer 55. For details, see Patent Literatures 1, 2, 3, and 4.

Such the radiation detector 60 has the both faces covered with the glass plate. This eliminates warp of the radiation detector 60 resulting from variations in temperature. Consequently, crack is prevented from occurring in an interior of the radiation detector 60.

The high resistance film 52 has a function as carrier selection that blocks charge injection from the electrode layer 53. In addition, high resistance film 52 has a function of separating the amorphous selenium layer 51 away from the insulating resin layer 55. The insulating resin layer 55 is provided for electrically shielding the electrode layer 53.

The wire 58 is provided for applying electric potential of a ground to each of the detecting elements in the radiation detector 60. The wire 58 is electrically separated away from the electrode layer 53 via the high resistance film 52 and the amorphous selenium layer 51. This causes no short between the electrode layer 53 and the wire 58.

Figure 16:
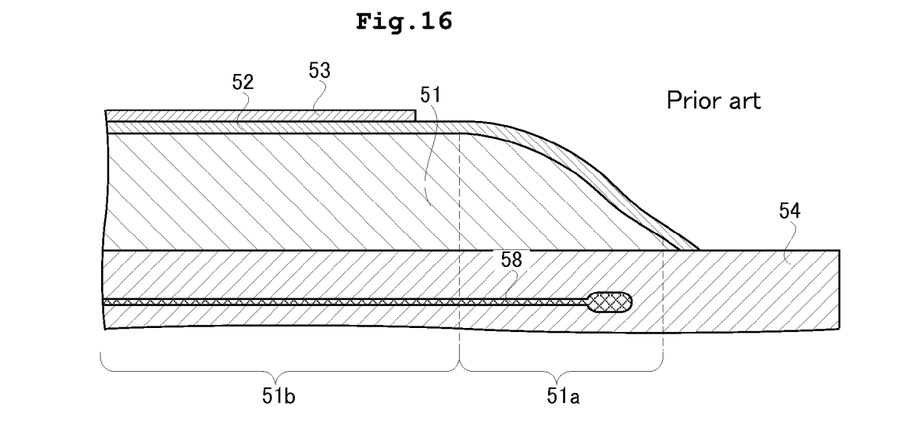

FIG. 16 illustrates an end portion of the radiation detector 60. As illustrated in FIG. 16, the amorphous selenium layer 51 has an end portion 51a with a film thickness thereof gradually decreasing and a center portion 51b with a film thickness not decreasing. The wire 58 mentioned above is also connected to the end portion of the radiation detector 60. The wire 58 in the end portion of the radiation detector 60 is provided in a position corresponding to the end portion 51a of the amorphous selenium layer 51. With the conventional construction, the high resistance film 52 also covers the end portion 51 of the amorphous selenium layer 51. On the other hand, no electrode layer 53 is provided over the end portion 51a of the amorphous selenium layer 51.

CITATION LIST

Patent Literature 1: Japanese Patent Publication No. 2004-228448A
Patent Literature 2: Japanese Patent Publication No. 2008-227347A
Patent Literature 3: Japanese Patent Publication No. 2009-99941A

SUMMARY OF INVENTION

Technical Problem

The conventional radiation detector, however, has the following drawback. That is, in the conventional construction, short occurs between different types of electric wires, causing damages in the radiation detector 60. Such a drawback may arise.

The radiation detector 60 includes a plurality of types of electric wires arranged vertically and horizontally. The electric wires are insulated via the interlayer insulating layer such that no short occurs between the wires at an intersection of the wires. When the intersection of the wire is located in the end portion where the film thickness of the amorphous selenium layer 51 gradually decreases, short of the wires likely occurs at the portion.

Figure 17:
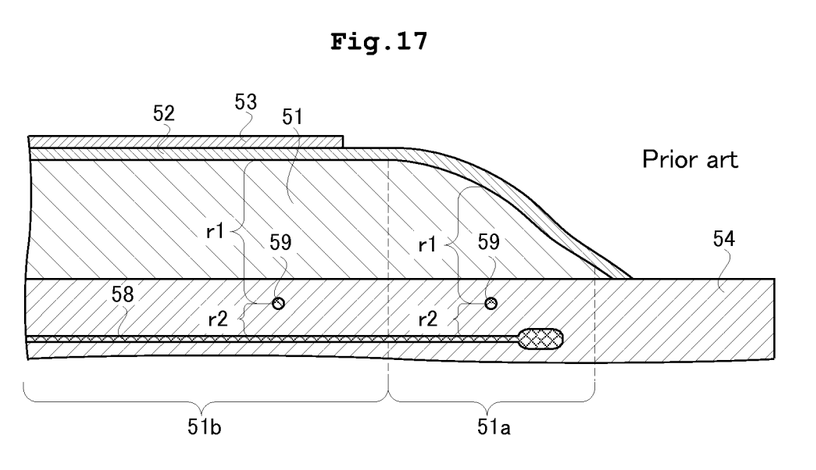

Description will be given next of a situation where short occurs between two electric wires crossing over each other three-dimensionally in skew lines. As illustrated in FIG. 17, it is assumed that wires 58 and 59, an amorphous selenium layer 51, and an electrode layer 53 are laminated in this order. The different types of wires 58 and 59 are in skew lines and cross over each other three-dimensionally.

A voltage of a cross over portion between the electrode layer 53 and the wire 58 is split to two resistances. Specifically, the voltage is split to a first resistance r1 generated with the amorphous selenium layer 51 and a second resistance r2 generated with an interlayer insulating layer, not shown, between the wires 58 and wire 59. See FIG. 17.

Next, an amount of voltage applied to the two resistances is to be considered. When a cross over portion is in a thick portion of the amorphous selenium layer 51 illustrated on the left side of FIG. 17, the resistance generated with the amorphous selenium layer 51 is high, resulting in application of high voltages to the first resistance r1. This causes application of not so high voltages to the second resistance r2.

On the other hand, when the cross over portion is in a thin portion of the amorphous selenium layer 51 illustrated on the right side of FIG. 17, the resistance generated with the amorphous selenium layer 51 is lower. Accordingly, the voltage applied to the first resistance r1 becomes lower. This causes application of higher voltage to the second resistance r2. The electrode layer 53 applying voltages is not provided on the thin portion of the amorphous selenium layer 51, but the high resistance film 52 has some conductivity. Consequently, the electrode layer 53 also causes the thin portion of the amorphous selenium layer 51 to be exposed to an electric field.

The interlayer insulating layer, not shown, between the wires 58 and wire 59 has a not so-high dielectric strength. Application of high voltages to the interlayer insulating layer (second resistance r2) at the cross over portion of the wires 58 and 59 causes damages in the interlayer insulating layer and short between the wires 58 and 59.

Figure 18:
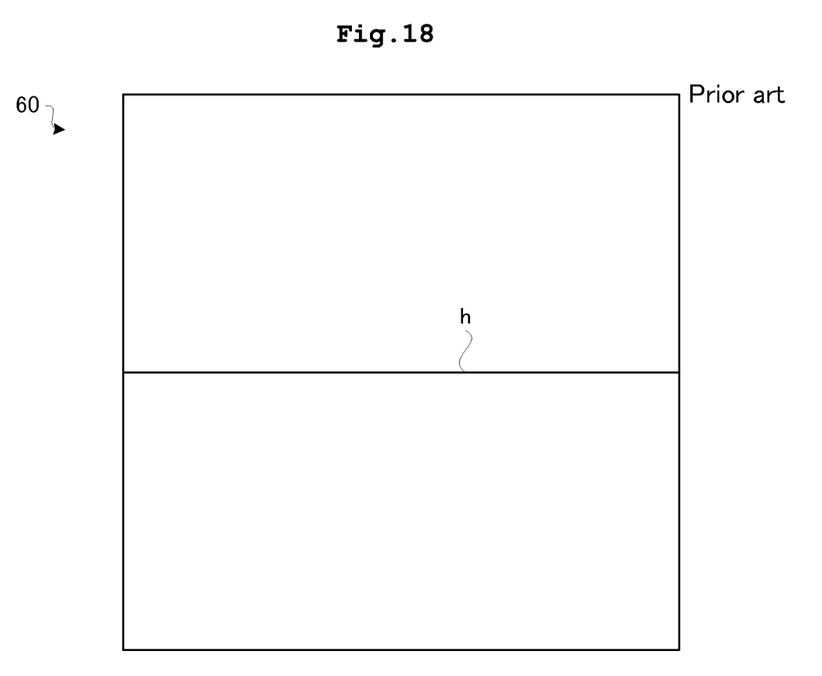
FIG. 18 is a plan view of the conventional X-ray detector.

Then defective detecting elements are generated at a portion where short between the wires 58 and 59 occurs. The defective detecting elements appear not only in the end portion of the radiation detector 60, but also in line and become defective simultaneously as illustrated in FIG. 18. The defective detecting elements appear as a linear defect h. No radiation is detected at the linear defect any more.

Such the linear defect h appears as a false image in a radiation image generated in accordance with detection signals from the radiation detector 60. Consequently, a linear false image is to appear in the radiation image due to partial short between different electric wires. The linear false image causes interference for diagnosis.

The present invention has been made regarding the state of the art noted above, and its primary object is to provide a radiation detector that allows elimination of short between electric wires crossing over each other via an interlayer insulating layer and allows suppression of defective detecting elements.

Solution to Problem

The present invention adopts the following construction for overcoming the above drawback. One embodiment of the present invention discloses a radiation detector including a matrix substrate arranged two-dimensionally and configured to read out signals from each of detecting elements, a semiconductor layer configured to generate carriers upon incidence of radiation, and an electrode layer configured to apply voltage, the matrix substrate, the semiconductor layer, and the electrode layer being laminated in this order, the semiconductor layer including a center portion with a layer thickness under the electrode layer and a tapered end portion thinner than the center portion, the matrix substrate including electric wires in skew lines, wherein a cross over portion where the electric wires overlap when seen from the semiconductor layer is disposed in a position covered with the center portion of the semiconductor layer.

Operation and Effect

A construction of an aspect of the present invention has a design idea for eliminating short between different electric wires. Specifically, the cross over portion of the electric wires is disposed in the position covered with the thick center portion of the semiconductor layer. This ensures to separate the cross over portion of the electric wires away from the electrode layer. Thus, short of the electric wires crossing over each other can be eliminated. Accordingly, the aspect of the present invention causes suppression of defective detecting elements resulting from short of the different electric wires, and thus allows provision of the radiation detector capable of being used for a long period of time.

In addition, each of the electric wires of the radiation detector is preferably a trunk line wire. The trunk line wire is formed by making a bundle of bus line wires electrically connected to ground electrodes of a capacitor of the detecting elements to apply reference electric potential.

Operation and Effect

The above construction is a detailed construction of the radiation detector according to the present invention. That is, the construction in which the electrode layer and the trunk line wire are separated from the thick semiconductor layer allows elimination of generation of the defective detecting elements in the radiation detector, the trunk line wire being formed by making a bundle of the bus line wires electrically connected to the ground electrodes of the detecting elements to apply the reference electric potential. Here, the trunk line wire is provided in the radiation detector closest to a periphery edge of the radiation detector. Accordingly, the other wires ensure to be disposed in the thick portion of the semiconductor layer.

Another aspect of the present invention discloses a radiation detector including a matrix substrate arranged two-dimensionally and configured to read out signals from each of detecting elements, a semiconductor layer configured to generate carriers upon incidence of radiation, a resistance film configured to pass through the carriers selectively, and an electrode layer configured to apply voltage, the matrix substrate, the semiconductor layer, the resistance film, and the electrode layer being laminated in this order, the matrix substrate including electric wires in skew lines, the matrix substrate having an exposed region not covered with the resistance film at an end portion of the matrix substrate, wherein a cross over portion where the electric wires overlap when seen the matrix substrate from the semiconductor layer is disposed in the exposed region of the matrix substrate except for a position covered with the resistance film.

Operation and Effect

The above construction is another construction that may achieve the object of the present invention. Specifically, the cross over portion where short between the electric wires likely occurs is provided in the exposed region of the matrix substrate except for the position covered with the resistance film. The resistance film has a property of selectively passing through the carriers. Accordingly, the resistance film has a certain property of passing through current. Consequently, provision of the electric wires in the position covered with the resistance film causes a phenomenon in which current flows from the electrode layer to the electric wires via the resistance film. This may generate the defective detecting elements. In the embodiment of the present invention, the cross over portion of the electric wires is provided in the exposed region where the matrix substrate is not covered with the resistance film. Thus, no resistance film exists above the cross over portion of the electric wires. This eliminates short of the electric wires crossing over each other. Consequently, the embodiment of the present invention causes suppression of defective detecting elements resulting from short of the different electric wires, and thus allows provision of the radiation detector capable of being used for a long period of time.

In addition, the above radiation detector preferably includes an epoxy resin layer (insulating layer) configured to cover the electrode layer and the exposed region of the matrix substrate, and the cross over portion of the electric wires is preferably disposed in a position covered with the insulating layer.

Operation and Effect

The above construction is a detailed construction of the radiation detector according to the present invention. Provision of the cross over portion of the electric wires at the position covered with the insulating layer ensures to provide the cross over portion of the electric wires away from the position covered with the resistance film.

In addition, the above radiation detector preferably includes an insulating layer configured to cover the electrode layer and the exposed region of the matrix substrate. The above radiation detector preferably further includes an auxiliary plate configured to cover the insulating layer, and a spacer having a tubular shape following a shape of a periphery edge of the matrix substrate and configured to link the auxiliary plate and the matrix substrate at periphery edges thereof. The cross over portion of the electric wires is preferably disposed in a position covered with the spacer.

Operation and Effect

The above construction is a detailed construction of the radiation detector according to the present invention. Provision of the cross over portion of the electric wires in the position covered with the spacer ensures to locate the cross over portion of the electric wires away from the position covered with the resistance film.

Advantageous Effects of Invention

The construction of the present invention has a design idea of eliminating short of the electric wires. Specifically, the cross over portion of the electric wires is provided in the position covered with the thick center portion of the semiconductor layer. This ensures to separate the electric wires away from the electrode layer, eliminating short of the electric wires crossing over each other. Consequently, the embodiment of the present invention causes suppression of defective detecting elements resulting from short of the electric wires, and thus allows provision of the radiation detector capable of being used for a long period of time.

REFERENCE SIGN LIST

R exposed region
S trunk line wire (electric wire)
1 amorphous selenium layer (semiconductor layer)
1a end portion
1b center portion
2 second high resistance film (resistance film)
3 common electrode (electrode layer)
4 active matrix substrate (matrix substrate)
5 epoxy resin layer (insulating layer)
6 auxiliary plate

DESCRIPTION OF EMBODIMENTS

Description will be given hereinunder of the best mode for the present invention. X-rays in this embodiment correspond to radiation in the present invention.

Embodiment 1
<Overall Construction of X-Ray Detector>

Figure 1:
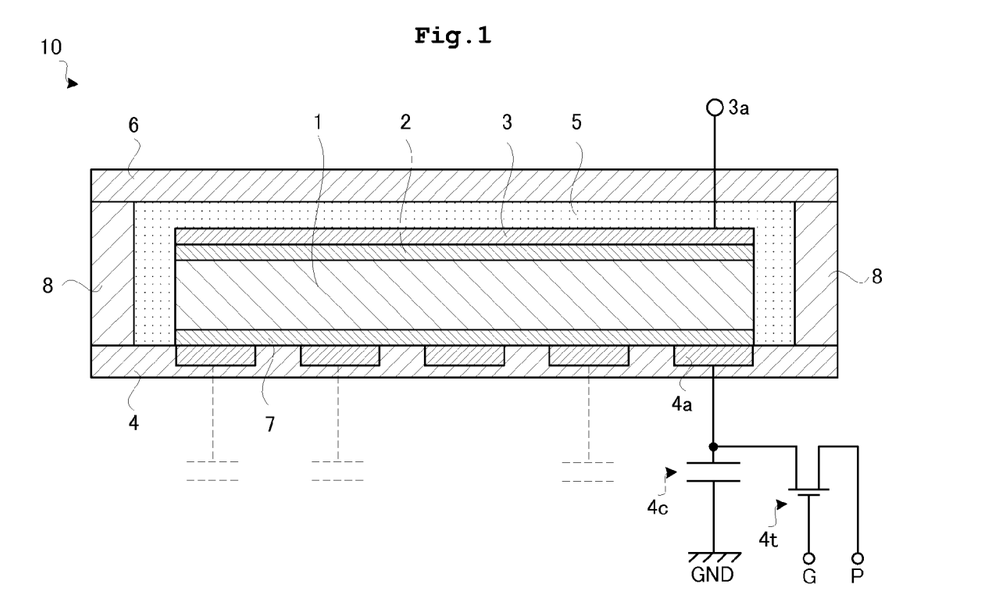
FIGS. 1 and 2 are sectional views each illustrating an X-ray detector according to Embodiment 1.

As illustrated in FIG. 1, an X-ray detector 10 according to Embodiment 1 includes an active matrix substrate 4 configured to store and read out charges induced through carrier movement, an amorphous selenium layer 1 configured to convert X-rays into a pair of carriers, a second high resistance film 2, a common electrode 3, an epoxy resin layer 5 formed by curing cold setting epoxy resin, and an auxiliary plate 6 composed of a glass. Here, the X-ray detector 10 has the active matrix substrate 4, a first high resistance film 7, the amorphous selenium layer 1, the second high resistance film 2, the common electrode 3, the epoxy resin layer 5, and the auxiliary plate 6 being laminated in this order. The X-ray detector corresponds to the radiation detector in the present invention.

The amorphous selenium layer 1 corresponds to the semiconductor layer in the present invention. The second high resistance film 2 corresponds to the resistance film in the present invention. The common electrode 3 corresponds to the electrode layer in the present invention. The active matrix substrate 4 corresponds to the matrix substrate in the present invention. The epoxy resin layer 5 corresponds to the insulating layer in the present invention.

The amorphous selenium layer 1 is composed of amorphous selenium of high purity having a resistivity equal to or larger than $10^9$ Ωcm (preferably, equal to or larger than $10^{11}$ Ωcm). The amorphous selenium layer 1 has a film thickness of 0.2 to 3.0 mm in a laminated direction. Incidence of X-rays into the amorphous selenium layer 1 causes generation of a pair of carriers of positive hole and electron. Since the amorphous selenium layer 1 is disposed on a strong electrical field, the carriers move along the electrical field to induce charges to collecting electrodes 4a formed in the active matrix substrate 4.

Figure 2:
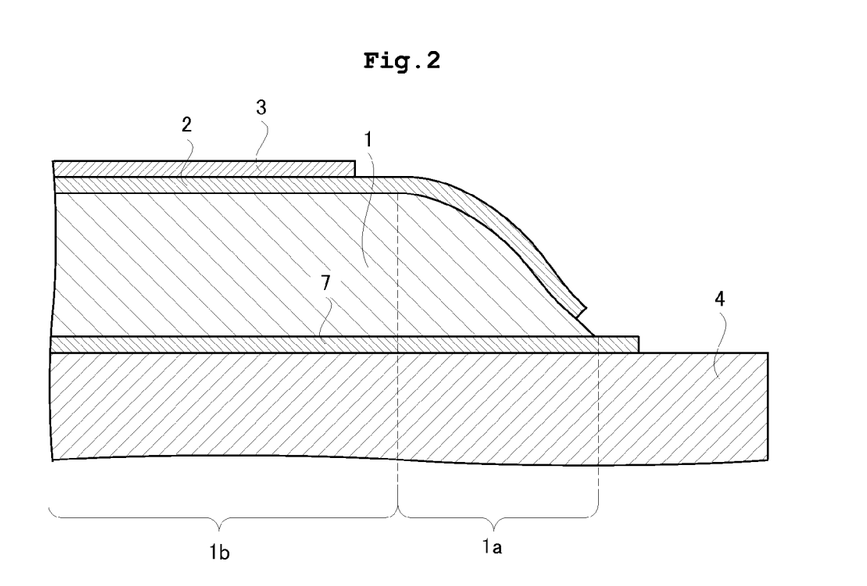

FIG. 2 illustrates the amorphous selenium layer 1. The amorphous selenium layer 1 is tapered at an end portion 1a where a layer thickness gradually decreases. This results from protruding of chemical compounds outside a mask upon growth of the amorphous selenium layer 1 on the active matrix substrate 4 and adhesion of the chemical compounds on the active matrix substrate 4. On the other hand, the amorphous selenium layer 1 has a center portion 1b as a flat portion having a film thickness gradually decreasing. The center portion is located at the other end (inside) of the amorphous selenium layer 1 relative to the end portion 1a. The common electrode 3 is provided on the center portion 1b of the amorphous selenium layer 1. Assuming that an average layer thickness of the center portion 1b is 100%, the end portion 1a has a layer thickness in a range of 0 to 80%.

Figure 3:
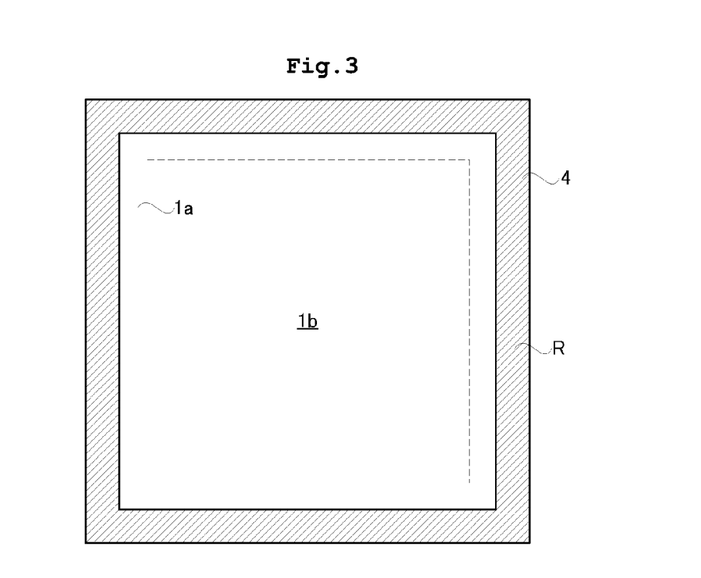
FIG. 3 is a plan view illustrating the X-ray detector according to Embodiment 1.

FIG. 3 is a plan view illustrating a positional relationship between the end portion 1a and the center portion 1b of the amorphous selenium layer 1. The active matrix substrate 4 is rectangular, and includes the second high resistance film 2, the amorphous selenium layer 1, and a picture-frame exposed region R with no first high resistance film 7 provided thereon. The amorphous selenium layer 1 is divided into a picture-frame end portion 1a inside the exposed region R of the active matrix substrate 4 and a center portion 1b further inside the end portion 1a.

The active matrix substrate 4 reads out signals from each of the detecting elements arranged two-dimensionally. Details of this are to be described. The active matrix substrate 4 includes collecting electrodes 4a for carrier collection formed on the glass substrate. The collecting electrodes 4a contact the first high resistance film 7, and are arranged two-dimensionally on a surface of the active matrix substrate 4. As illustrated in FIG. 1, the collecting electrode 4a is connected to a capacitor 4c for charge storage. The capacitor 4c stores charges collected with the collecting electrode 4a. The capacitor 4c is connected to a transistor 4t. The transistor 4t includes an input terminal connected to the capacitor 4c. Beside this, the transistor 4t includes a gate G for current control, and a read-out electrode P for detection signal reading. When the gate G of the transistor 4t is turned on, charges that are stored in the capacitor 4c flow to the read-out electrode P.

Figure 4:
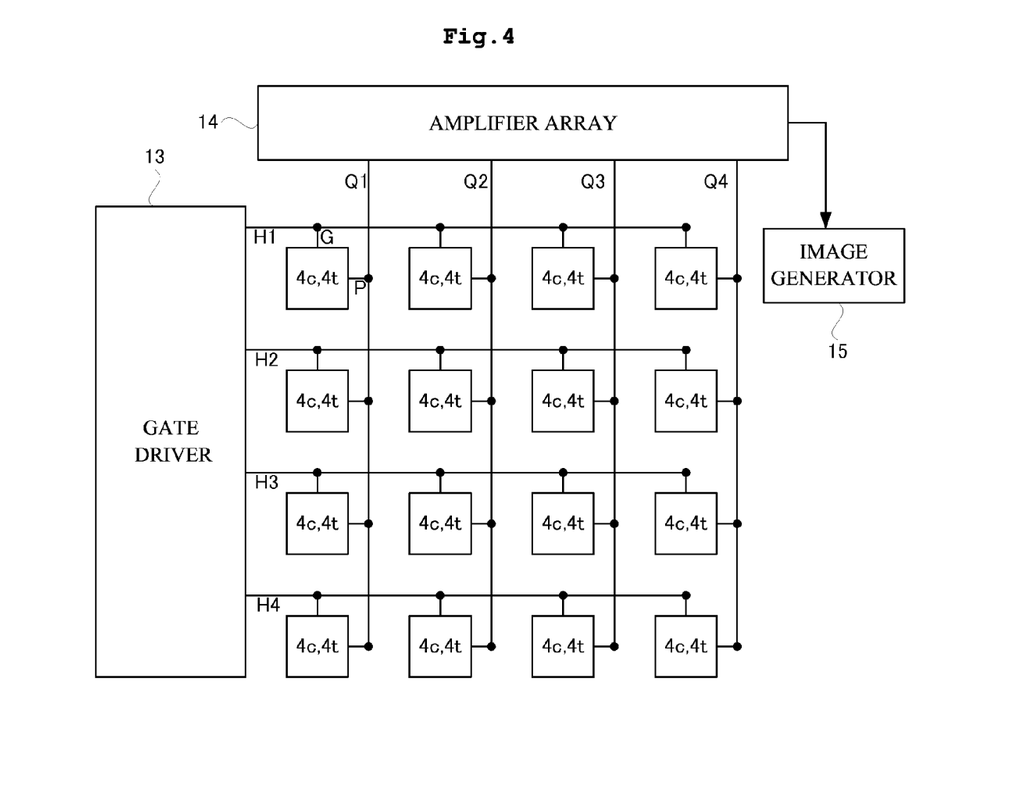
FIGS. 4 to 7 are schematic views each illustrating the X-ray detector according to Embodiment 1.

The transistors 4t arranged two-dimensionally are each connected to wires extending vertically and horizontally in a lattice pattern. Specifically, the read-out electrodes P of the transistors 4t arranged vertically in FIG. 4 are all connected to any of common amplifier electrodes Q1 to Q4. The gates G of the transistors 4t arranged horizontally in FIG. 4 are all connected to any of common gate control electrodes H1 to H4. The gate control electrodes H1 to H4 are connected to a gate driver 13, and the amplifier electrodes Q1 to Q4 are connected to an amplifier array 14.

Description will be given of reading out charges in each of the capacitors 4c. Here, each of the capacitors 4c in FIG. 4 stores charges. The gate driver 13 turns on the transistors 4t via the gate control electrode H1 simultaneously. The four transistors 4t turned on transmit charges (original signals) to the amplifier array 14 via the amplifier electrodes Q1 to Q4.

Subsequently, the gate driver 13 turns on the transistors 4t via the gate control electrode H2 simultaneously. In this way, the gate driver 13 turns on the gate control electrodes H1 to H4 in turn. The transistors 4t in different lines are turned on for every turning on of the gate control electrodes. As noted above, an FPD 4 reads out charges in each of the capacitors 4c for every line.

The amplifier array 14 is provided with amplifiers for each of the amplifier electrodes Q1 to Q4 for amplifying signals. Original signals inputted from the amplifier electrodes Q1 to Q4 to the amplifier array 14 are amplified at a given amplification factor. An image generator 15 generates fluoroscopic X-ray images in accordance with the original signals outputted from the amplifier array 14.

The collecting electrodes 4a, the capacitors 4c, and the transistors 4t constitute detecting elements for detecting X-rays. The detecting elements form a two-dimensional matrix in the active matrix substrate 4, the matrix having, for example, 3,072×3,072 pixels in rows and columns.

The common electrode 3 is made of gold. The common electrode 3 applies bias voltages to the amorphous selenium layer 1 via the second high resistance film 2. As illustrated in FIG. 1, the common electrode 3 is connected to a node 3a. Application of high electric potential to the node 3a causes application of positive bias voltages of 10 kV, for example, in the form of electric potential to the common electrode 3.

The first and second high resistance films 7 and 2 are composed of $Sb_2S_3$, for example, and selectively pass through electrons. The first and second high resistance films 7 and 2 have a film thickness of approximately 0.1 to 0.5 μm, and have resistivity of $10^9$ Ωcm or more.

Figure 5:
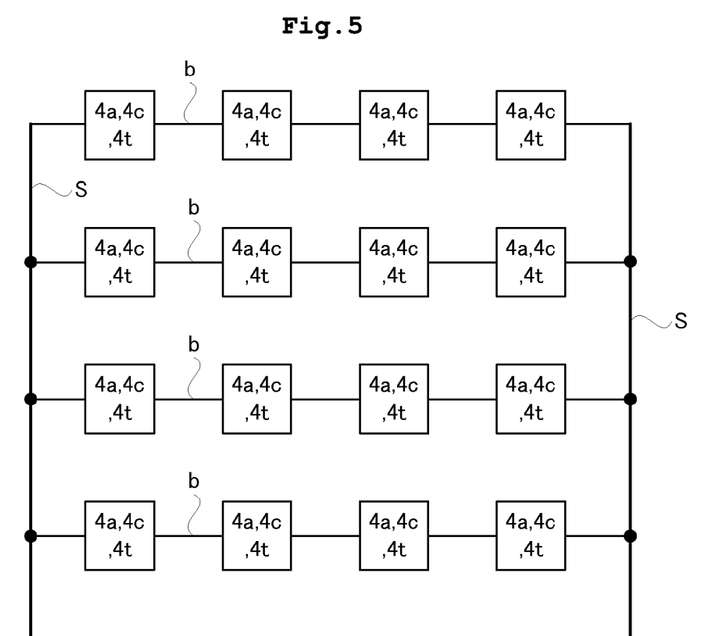

FIG. 5 illustrates a trunk line wire (CS trunk wire) S. As illustrated in FIG. 5, the trunk line wires S are wired to both ends of a matrix array of the detecting elements 4a, 4c, and 4t so as to extend vertically. Bus line wires b extending horizontally are connected to each of the detecting elements 4a, 4c, 4t arranged horizontally. The bus line wires b are tied in a bundle to form the trunk line wire S. The trunk line wire S has a thickness larger than that of the bus line wire b. The bus line wire b is electrically connected to the ground electrode GND of the capacitor 4c illustrated in FIG. 1. The reference electric potential, such as ground electric potential, is applied to the trunk line wire S. The trunk line wire S also corresponds to the electric wire in the present invention.

Figure 6:
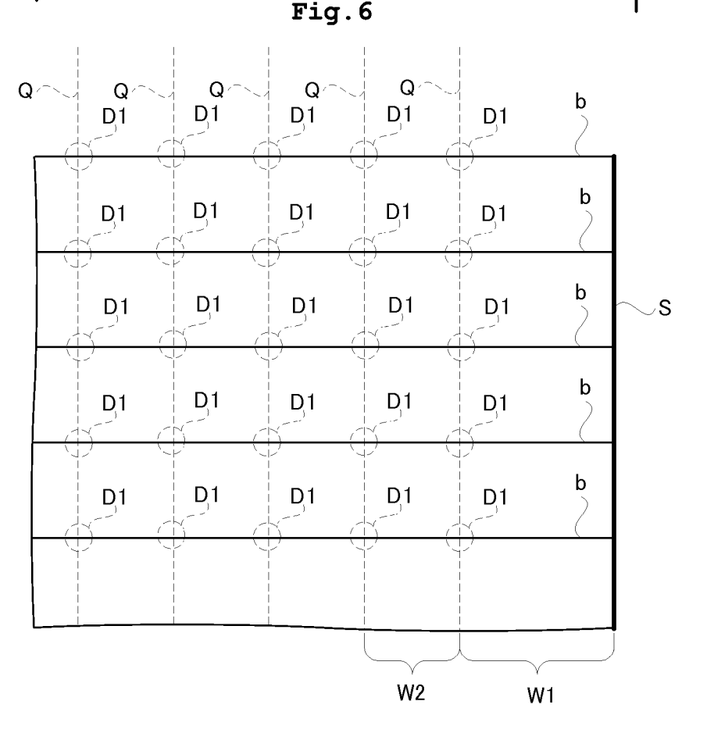

Description will be given of the cross over portion of the electric wires. FIG. 6 illustrates the bus line wires b extending horizontally and the wires of the amplifier electrode Q extending vertically that cross over each other. As illustrated in FIG. 6, the bus line wire b and the wire of the amplifier electrode Q (indicated by dotted lines in FIG. 6) cross over each other three-dimensionally and thus are in skew lines. The amplifier electrode Q is wired to an upper layer of the active matrix substrate 4. When the active matrix substrate 4 is seen from the amorphous selenium layer 1, both wires Q and b overlap each other. This point is called a cross over portion D1. Since both the wires Q and b cross over each other three-dimensionally, the cross over portion of the both wires Q and b is a point where both the wires Q and b approaches closest. The cross over portion D1 is each seen between a plurality of bus line wires b wired vertically and a plurality of wires of amplifier electrodes Q wired horizontally. The cross over portions D1 are arranged in a two-dimensional matrix when the active matrix substrate 4 is seen from the amorphous selenium layer 1.

A width between the cross over portions D1 adjacent horizontally is denoted by W2. The width W2 is equal to an arrangement pitch of the detecting elements. Denoted by W1 is a width between the trunk line wire S and the cross over portion D1 adjacent thereto horizontally. The width W1 is independent of the arrangement pitch of the detecting elements, and thus can be designed and varied flexibly.

Figure 7:
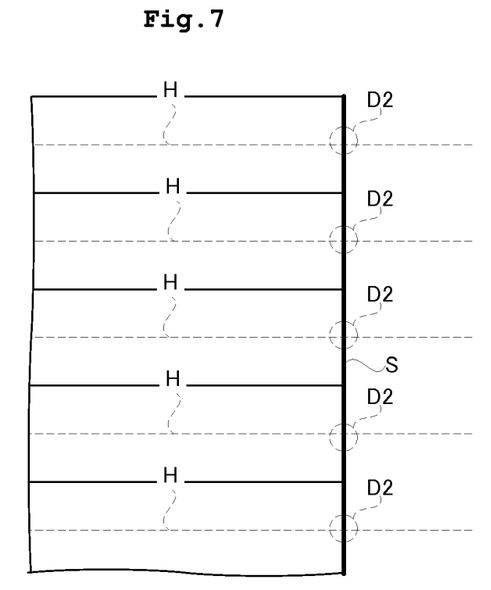

Description will be further given of the cross over portions of the electric wires. FIG. 7 illustrates a condition where the wires of the gate control electrodes H extending horizontally and the trunk line wires S extending vertically cross over each other. As illustrated in FIG. 7, the bus line wires of the trunk line wire Sb and the wires of the gate control electrodes H (indicated by dotted lines in FIG. 7) wired to the upper layer of the active matrix substrate 4 cross over each other three-dimensionally. Thus, the wires are each in skew lines. Denoted by D2 is a cross over portion wherein the both wires H and Sb overlap each other when the active matrix substrate 4 is seen from the amorphous selenium layer 1. Since the both wires H and Sb cross over each other three-dimensionally, the both wires H and Sb approach closest to each other at the cross over portion D2. The cross over portions D2 each exist between a plurality of wires of the gate control electrodes H arranged and wired horizontally and the trunk line wire S extending vertically. The cross over portions D2 are arranged vertically when the active matrix substrate 4 is seen from the amorphous selenium layer 1.

The insulating epoxy resin layer 5 covers the common electrode 3. Covering the common electrode 3 with the epoxy resin layer 5 causes the encapsulated common electrode 3 of high electric potential. The epoxy resin layer 5 also covers the picture-frame exposed region R of the active matrix substrate 4 illustrated in FIG. 3.

Specifically, the epoxy resin layer 5 also covers opposite ends of the second high resistance film 2, the amorphous selenium layer 1, and the first high resistance film 7 at the periphery of the X-ray detector 10. Accordingly, the epoxy resin layer 5 contacts the active matrix substrate 4 at the periphery of the X-ray detector 10. That is, the active matrix substrate 4 and the epoxy resin layer 5 encapsulate the common electrode 3, the second high resistance film 2, the amorphous selenium layer 1, and the first high resistance film 7. In other words, the epoxy resin layer 5 covers opposite ends of the common electrode 3, the second high resistance film 2, the amorphous selenium layer 1, and the first high resistance film 7. This avoids surface creepage in which electricity is discharged outside along non-encapsulated opposite ends due to voltages applied to the common electrode 3.

The auxiliary plate 6 is made of an insulating glass. The plate faces the epoxy resin layer 5. The plate has a thickness of 0.5 to 1.5 mm The auxiliary plate 6 has coefficient of thermal expansion almost equal to that of the active matrix substrate 4. This allows the auxiliary plate 6 to expand and contract similarly to the active matrix substrate 4 due to variations in outside air temperature. Accordingly, the X-ray detector 10 does not warp entirely in accordance with variations in outside air temperature, eliminating cracks in each layer.

A spacer 8 is prismatic following the shape of the periphery edge of the active matrix substrate 4, and links the auxiliary plate 6 and the active matrix substrate 4 at the periphery of the plates. The spacer 8 has an opening at one end contacting the active matrix substrate 4 and an opening at the other end contacting the auxiliary plate 6. As noted above, the spacer 8 links the active matrix substrate 4 and the auxiliary plate 6. The spacer 8 contains inside the openings thereof the common electrode 3, the second high resistance film 2, the amorphous selenium layer 1, the first high resistance film 7, and the epoxy resin layer 5.

Figure 8:
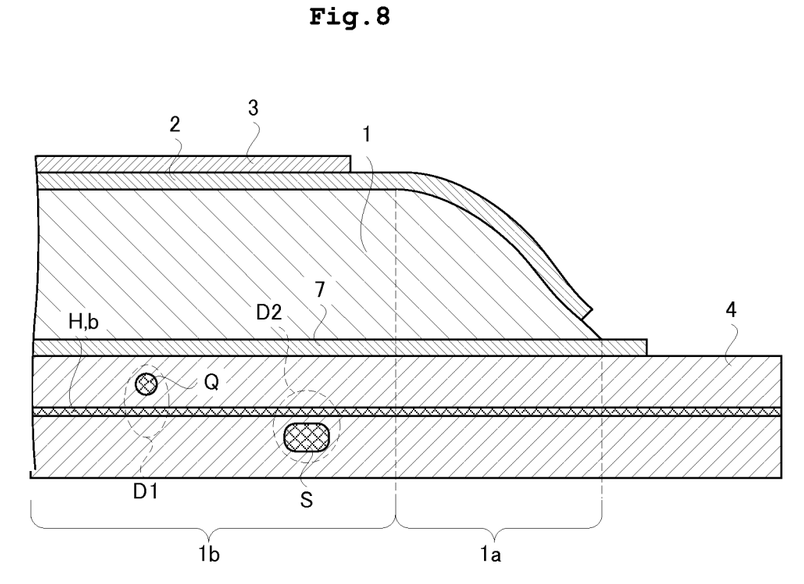
FIGS. 8 to 12 are sectional views each illustrating the X-ray detector according to Embodiment 1.

FIG. 8 illustrates a sectional view of the end portion of the X-ray detector 10 that is the characteristic feature in the present invention. Specifically, the cross over portion D2 of the trunk line wire S along one side of the periphery of the active matrix substrate 4 and the gate control electrode H is in a position, as illustrated in FIG. 8, where the active matrix substrate 4 is covered with the center portion 1b of the amorphous selenium layer 1. That is, the cross over portion D2 is in a position covered with the center portion 1b except for a position covered with the end portion 1a.

Such the construction achieves a satisfactory film thickness of the amorphous selenium layer 1 between the common electrode 3 and the trunk line wire S for avoiding short between the both wires H and S. Since the trunk line wire S is spaced away from the end portion of the amorphous selenium layer 1, no current flows between the both wires H and S through the second high resistance film 2 and the first high resistance film 7.

Such the construction is not limited to the cross over portion D2. Specifically, the cross over portion D1 of the both wires Q and b on the periphery of the active matrix substrate 4 is in the position covered with the center portion 1b except for the position covered with the end portion 1a. Thus, the active matrix substrate 4 contains cross over portions of various wires. Among these, the cross over portion D2 of the trunk line wire S and the wires of the gate control electrode H is closest to the periphery edge of the active matrix substrate 4. Provision of the cross over portions D2 in the position covered with the center portion 1b of the amorphous selenium layer 1 ensures to cause the cross over portions D1, closer to inside the active matrix substrate 4 than the cross over portions D2, to be in the center portion 1b of the amorphous selenium layer 1. This prevents short of wires at not only cross over portion D2 but also cross over portion D1.

Figure 9:
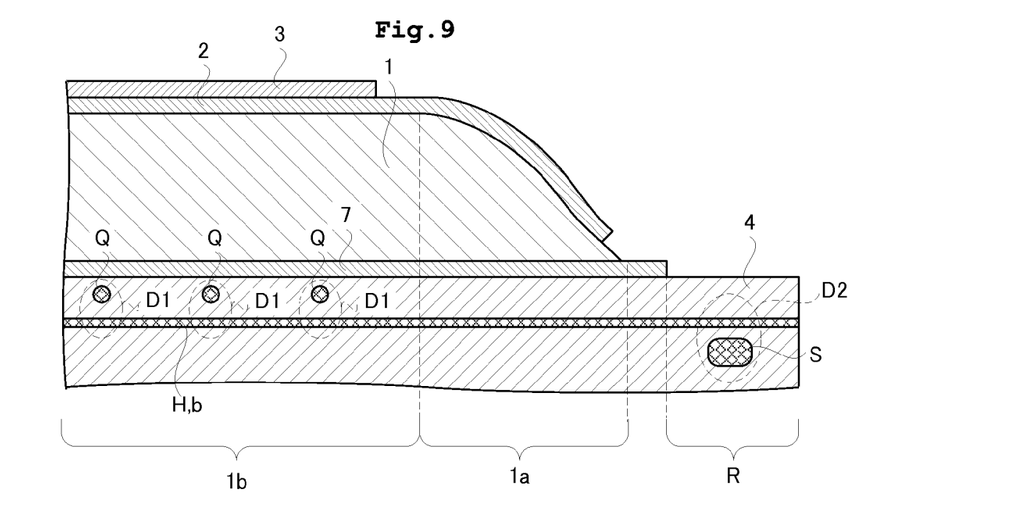

FIG. 9 is a sectional view of the end portion of the X-ray detector 10, which illustrates a different construction from that in FIG. 8. Specifically, FIG. 9 illustrates a cross over portion D2 of the trunk line wire S along the periphery edge of the active matrix substrate 4 and the wire of the gate control electrode H. The cross over portion D2 is in a position corresponding to the exposed region R of the active matrix substrate 4 except for the position covered with the second high resistance film 2 and the first high resistance film 7. On the other hand, as illustrated in FIG. 8, the cross over portion D1 of both the wires Q and b is in a position covered with the center portion 1b except for the position covered with the end portion 1a. This eliminates short of both the wires Q and b.

Such the construction causes the trunk line wire S to be spaced away from the end portion of the amorphous selenium layer 1. This prevents current from flowing between the both wires H and S through the second high resistance film 2 and the first high resistance film 7.

Figure 10:
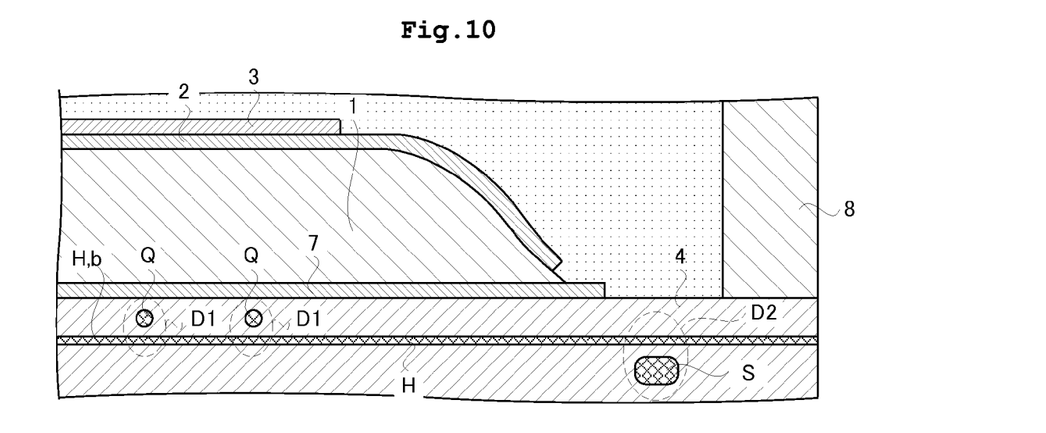
Figure 11:
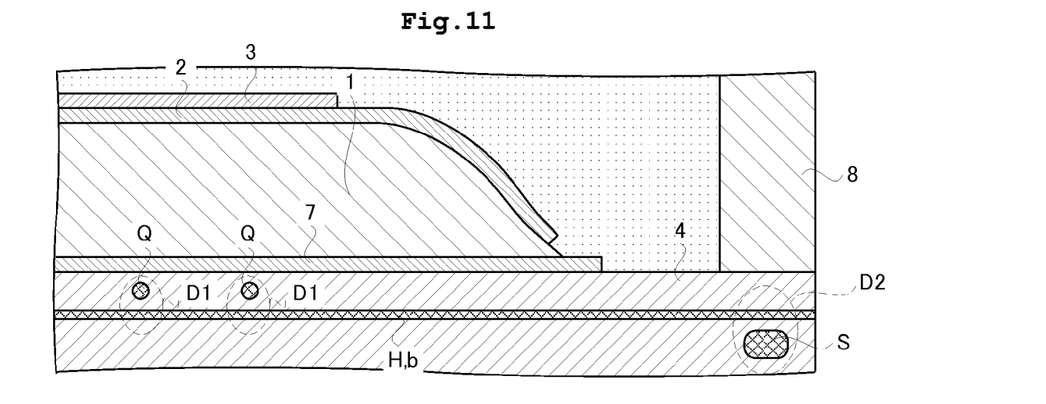

The exposed region R is covered with the epoxy resin layer 5 or the spacer 8. FIG. 10 illustrates one example where the cross over portion D2 is in a position covered with the epoxy resin layer 5. FIG. 11 illustrates on example where the cross over portion D2 is in a position covered with the spacer 8. In each case, the construction of FIG. 9 is adopted. As illustrated in FIG. 6, the width W1 between the cross over portion D1 and the trunk line wire S is variable flexibly, facilitating achieving the construction as in FIG. 9 or FIG. 10.

The construction of FIG. 8 differs from that of FIG. 9 in position of the trunk line wire S. On the other hand, in each case, short of the wire of the gate control electrode H and the trunk line wire S can be suppressed, causing suppression of a linear false image in the X-ray image.

Figure 12:
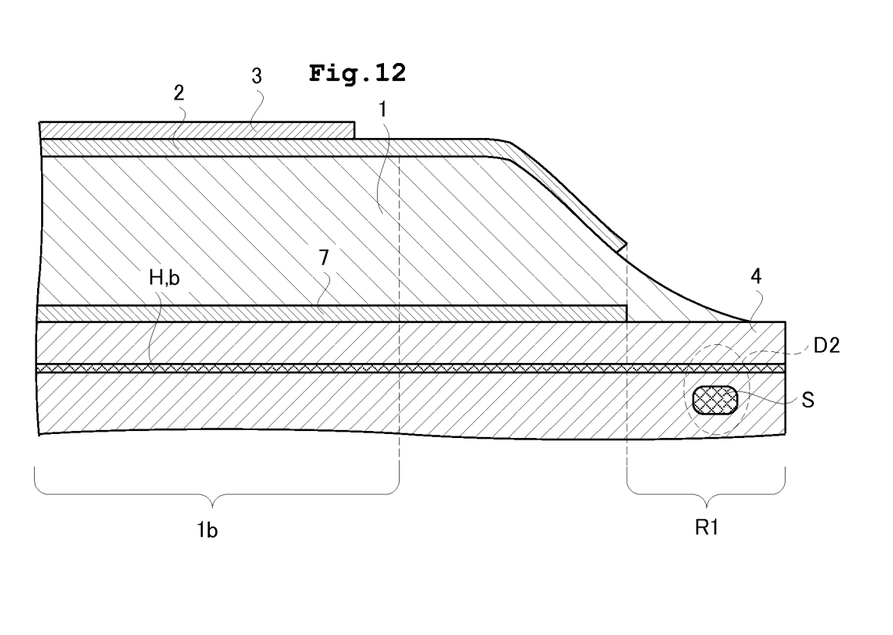

FIG. 12 illustrates a construction similar to that of FIG. 9 in the present invention. Specifically, FIG. 12 illustrates the end portion 1a of the amorphous selenium layer 1 extending widely outside the active matrix substrate 4. In FIG. 12, a region where the amorphous selenium layer 1 fails to cover the active matrix substrate 4 is too small to include the trunk line wire S.

In this case, as illustrated in FIG. 12, the first high resistance film 7 fails to cover the entire end portion of the amorphous selenium layer 1. Then, as illustrated in FIG. 12, the end portion of the amorphous selenium layer 1 is exposed from the first high resistance film 7. The trunk line wire S is in the exposed region R of the active matrix substrate 4 except for the position covered with the first high resistance film 7. Accordingly, the cross over portion D2 is also in the exposed region R. Here, the exposed region R is exposed from the first high resistance film 7, and thus is not exposed from the amorphous selenium layer 1. Here, the cross over portion D1, not shown, is in the position covered with the center portion 1b of the amorphous selenium layer 1.

Figure 13:
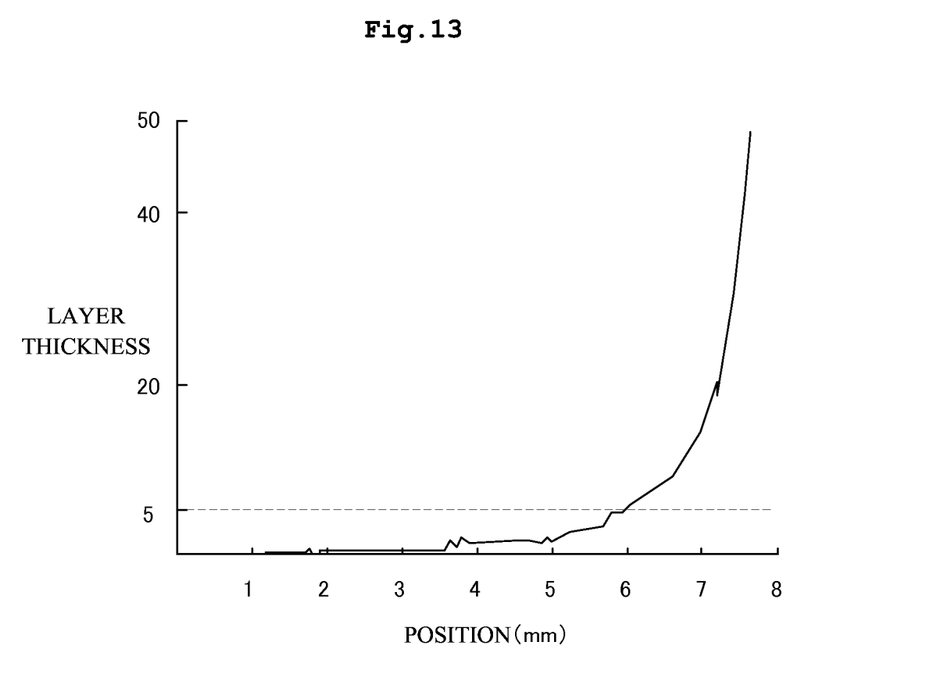
FIG. 13 is a schematic view of the X-ray detector according to Embodiment 1.

Experiments have confirmed effects of the present invention also with such the construction in FIG. 12. Thus, results of the experiments are to be described. FIG. 13 illustrates actual measurement results about a film thickness of the end portion of the amorphous selenium layer 1 grown on the substrate. As illustrated in FIG. 13, a thin layer composed of amorphous selenium and having a thickness of 0 to 5 μm expands over a wide range. Endurance tests were performed to the X-ray detector 10 when the trunk line wire S was arranged in a thin layer of 5μ or less.

TABLE 1

|  | endurance time (h) |
| --- | --- |
| A1 | 5,544 or more |
| A2 | 4,440 or more |
| B1 | 5,422 or more |
| B2 | 2,769 or more |
| C1 | 2,769 or more |
| C2 | 2,769 or more |
| C3 | 2,769 or more |
| control 1 | 2,250 |
| control 2 | 2,450 |
| control 3 | 2,250 |

The above table indicates a time (endurance time) of each construction until defective detecting elements are generated due to partial short of the wire of the gate control electrode H and the trunk line wire S. Experimental results using the X-ray detector described in FIG. 8 are denoted by A1 and A2 in the table. Specifically, in A1 and A2, the trunk line wire S in the X-ray detector is in a position covered with the center portion 1b of the amorphous selenium layer 1. Moreover, experimental results using the X-ray detector described in FIG. 9 are denoted by B1 and B2. Specifically, in B1 and B2, the trunk line wire S in the X-ray detector is in the exposed region R of the active matrix substrate 4 and is not in a position covered with the high resistance films 2 and 7 and the amorphous selenium layer 1.

Experimental results using the X-ray detector described in FIG. 12 are denoted by C1, C2, and C3 in the table. Specifically, in C1, C2, and C3, the trunk line wire S in the X-ray detector is in the exposed region R of the active matrix substrate 4 and is not in a position covered with the high resistance films 2 and 7. The trunk line wire S is in a position covered with the amorphous selenium layer 1. In the position where the trunk line wire S is disposed, the amorphous selenium layer 1 has a film thickness of 5 μm or less.

Figure 14:
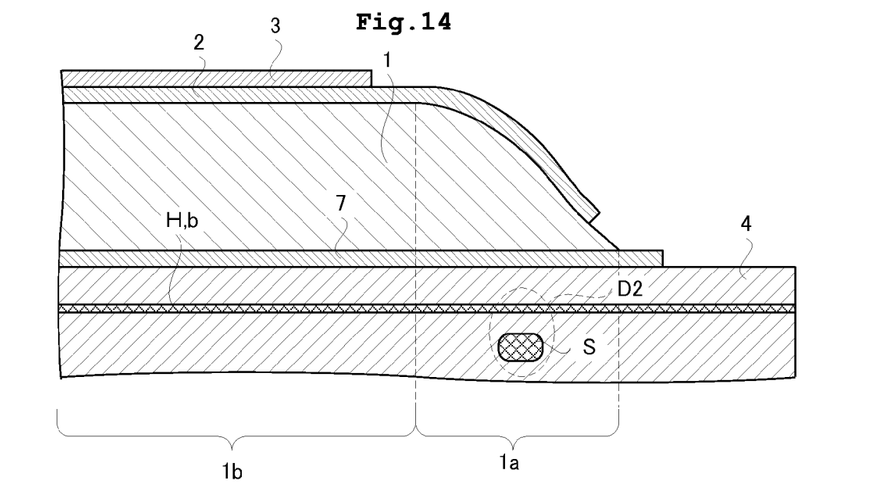
FIG. 14 is a sectional view of the X-ray detector according to Embodiment 1.

Experimental results using a conventional X-ray detector are denoted by "control" in the table. Specifically, in "control", the trunk line wire S in the X-ray detector is in a position covered with the end portion 1a of the amorphous selenium layer 1 as illustrated in FIG. 14. Accordingly, the cross over portion D2 is also in the position covered with the end portion 1a.

The X-ray detector with the conventional construction (the construction in "control") generated defective detecting elements within 2,450 hours of starting the experiments. The conventional construction had an average endurance time of 2,317 hours. On the other hand, the construction (the construction in A1, A2) in FIG. 8 of the present invention generated no defective detecting element after 4,440 or more hours elapsed from starting the experiments. The construction of FIG. 8 had an average endurance time of 4,992 hours or more.

The construction (the construction in B1 and B2) in FIG. 9 of the present invention generated no defective detecting element after 2,769 hours or more elapsed from starting the experiments. The construction of FIG. 9 had an average endurance time of 4,096 hours or more.

The construction (the construction in C1, C2, and C3) in FIG. 12 of the present invention generated no defective detecting element after 2,769 hours or more elapsed from starting the experiments. The construction of FIG. 12 had an average endurance time of 2,769 hours or more.

Each construction of the present invention has a longer endurance time than that of the conventional construction. Consequently, the experiments have confirmed satisfactorily enhanced t durability of the X-ray detector even when the trunk line wire S is in the position covered with the amorphous selenium layer 1 as in FIG. 12. As noted above, an effect of the present invention is expectable with the amorphous selenium layer 1 having a layer thickness of 5 μm or less at a position covering the trunk line wire S. Ideally, it is more desirable that the layer thickness of the amorphous selenium layer 1 is from 0 μm to 1 μm.

As noted above, the construction of the present invention has a design idea for eliminating short of different electric wires. Specifically, the cross over portions D1 and D2 of the electric wires are in the positions covered with the thick center portion 1b of the amorphous selenium layer 1. This ensures to space the cross over portions D1 and D2 of the electric wires away from the common electrode 3, causing no short of the wires crossing over each other. Consequently, the embodiment of the present invention allows suppression of the defective detecting elements generated due to short of different electric wires, thereby providing a radiation detector capable of being used for a long period of time.

In addition, FIGS. 9 to 12 each illustrate another construction that allows achieving the object of the present invention. Specifically, frequent generation of the defective detecting elements in the radiation detector can be eliminated with the construction in which the common electrode 3 and the trunk line wire S electrically connected to the ground electrodes of the capacitors of the detecting elements are separated from the thick amorphous selenium layer 1. Here, the trunk line wire S is provided in the radiation detector closest to the periphery edge of the radiation detector. Accordingly, the other wires ensure to be disposed in the thick portion of the amorphous selenium layer 1.

In addition, as illustrated in FIG. 9, the cross over portion D2 where short of the electric wires likely occurs may be in the exposed region R of the active matrix substrate 4 except for the position covered with the second high resistance film 2. The second high resistance film 2 has a property of selectively passing through the carriers. Accordingly, the second high resistance film 2 has a certain property that current flows. Consequently, provision of the trunk line wire S in the position covered with the second high resistance film 2 causes a phenomenon that current flows from the common electrode 3 to the trunk line wire S via the second high resistance film 2. This may generate the defective detecting elements. The embodiment of the present invention includes the cross over portion D2 of the trunk line wire S in the exposed region R wherein the active matrix substrate 4 is not covered with the second high resistance film 2. Thus, no second high resistance film 2 exists above the cross over portion D2 of the trunk line wire S. This eliminates short of the electric wires crossing over each other. Consequently, the embodiment of the present invention causes suppression of the defective detecting elements resulting from short of the different electric wires, and thus allows provision of the radiation detector capable of being used for a long period of time.

The present invention is not limited to the constructions as above, but may be modified as under.

(1) In the embodiment mentioned above, the active matrix substrate is manufactured. Instead of this, a passive matrix substrate may be manufactured.

(2) In the embodiment mentioned above, the bottom-gate active matrix substrate is manufactured. Alternatively, a top-gate active matrix substrate may be manufactured.

(3) The embodiment mentioned above describes one example in which the bus line wire b runs parallel to the wire of the gate control electrode H. Alternatively, the bus line wire b may run parallel to the wire of the amplifier electrode Q. In this case, the trunk line wire S having the bus line wires b tied in a bundle will cross over the wires of the amplifier electrodes Q.

INDUSTRIAL APPLICABILITY

The present invention is suitable for a medical radiographic apparatus.

The invention claimed is:
1. A radiation detector comprising:
a matrix substrate arranged two-dimensionally and configured to read out signals from each of detecting elements;
a semiconductor layer configured to generate carriers upon incidence of radiation; and
an electrode layer configured to apply voltage, the matrix substrate, the semiconductor layer, and the electrode layer being laminated in this order, the semiconductor layer comprising a center portion with a layer thickness under the electrode layer and a tapered end portion thinner than the center portion, the matrix substrate comprising electric wires which cross each other, wherein a crossing portion where the electric wires cross each other when seen from the semiconductor layer is disposed in a position covered with the center portion of the semiconductor layer except for a position covered with the end portion.

2. The radiation detector according to claim 1, wherein each of the electric wires of the radiation detector is a trunk line wire formed by making a bundle of bus line wires electrically connected to ground electrodes of a capacitor of the detecting elements to apply reference electric potential.

3. A radiation detector comprising:

a matrix substrate arranged two-dimensionally and configured to read out signals from each of detecting elements;

a semiconductor layer configured to generate carriers upon incidence of radiation;

a resistance film configured to pass through the carriers selectively; and an electrode layer configured to apply voltage, the matrix substrate, the semiconductor layer, the resistance film, and the electrode layer being laminated in this order, the matrix substrate comprising electric wires which cross each other, the matrix substrate having an exposed region not covered with the resistance film at an end portion of the matrix substrate, wherein a crossing portion where the electric wires cross each other when the matrix substrate is seen from the semiconductor layer is disposed in the exposed region of the matrix substrate except for a position covered with the resistance film and each of the electric wires of the radiation detector is a trunk line wire formed by making a bundle of bus line wires electrically connected to ground electrodes of a capacitor of the detecting elements to apply reference electric potential.

4. The radiation detector according to claim 3, further comprising:

an insulating layer configured to cover the electrode layer and the exposed region of the matrix substrate, wherein the crossing portion of the electric wires is disposed in a position covered with the insulating layer.

5. The radiation detector according to claim 3, further comprising:

an insulating layer configured to cover the electrode layer and the exposed region of the matrix substrate;

an auxiliary plate configured to cover the insulating layer; and a spacer having a tubular shape following a shape of a periphery edge of the matrix substrate and configured to link the auxiliary plate and the matrix substrate at periphery edges thereof, wherein the crossing portion of the electric wires is disposed in a position covered with the spacer.

* * * * *